United States Patent
Ko

(10) Patent No.: US 8,509,012 B2
(45) Date of Patent: Aug. 13, 2013

(54) PRECHARGE SIGNAL GENERATION CIRCUIT OF SEMICONDUCTOR MEMORY APPARATUS

(75) Inventor: Jae Bum Ko, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 156 days.

(21) Appl. No.: 13/171,850

(22) Filed: Jun. 29, 2011

(65) Prior Publication Data
US 2012/0127809 A1 May 24, 2012

(30) Foreign Application Priority Data
Nov. 23, 2010 (KR) .................. 10-2010-0116893

(51) Int. Cl.
*G11C 7/00* (2006.01)
(52) U.S. Cl.
USPC ............ 365/194; 365/193; 365/203; 365/204
(58) Field of Classification Search
USPC .................................. 365/193, 194, 203, 204
See application file for complete search history.

(56) References Cited

U.S. PATENT DOCUMENTS

| | | | | |
|---|---|---|---|---|
| 5,600,605 A | * | 2/1997 | Schaefer | 365/233.1 |
| 5,748,560 A | * | 5/1998 | Sawada | 365/230.03 |
| 5,973,990 A | * | 10/1999 | Sakurai | 365/233.1 |
| 6,330,636 B1 | * | 12/2001 | Bondurant et al. | 711/105 |
| 7,068,564 B2 | * | 6/2006 | Jacunski et al. | 365/194 |
| 7,495,973 B2 | * | 2/2009 | Jung et al. | 365/194 |

FOREIGN PATENT DOCUMENTS

| | | |
|---|---|---|
| KR | 100736397 B1 | 6/2007 |
| KR | 1020090017222 A | 2/2009 |
| KR | 1020090060605 A | 6/2009 |

* cited by examiner

*Primary Examiner* — Viet Q Nguyen
(74) *Attorney, Agent, or Firm* — William Park & Associates Patent Ltd.

(57) ABSTRACT

A precharge signal generation circuit of a semiconductor memory apparatus may comprise a read/write precharge command generation section configured to delay a precharge command by a first delay time set in response to a control signal to generate one of a read precharge command and a write precharge command; and a read/write bank precharge address generation section configured to delay a bank column address strobe signal by a second delay time set in response to the precharge command delayed in the read/write precharge command generation section, and generate one of a read bank precharge address and a write bank precharge address.

14 Claims, 10 Drawing Sheets

FIG.5

| TWR | TWRX<3> | TWRX<2> | TWR_C1 | TWR_C2 | TWR_C3 | TWR_C4 |
|---|---|---|---|---|---|---|
| 5 | 0 | 0 | 1 | 0 | 0 | 0 |
| 6 | 0 | 0 | 0 | 1 | 0 | 0 |
| 7 | 0 | 0 | 0 | 0 | 1 | 0 |
| 8 | 0 | 0 | 0 | 0 | 0 | 1 |
| 9 | 0 | 1 | 1 | 0 | 0 | 0 |
| 10 | 0 | 1 | 0 | 1 | 0 | 0 |
| 11 | 0 | 1 | 0 | 0 | 1 | 0 |
| 12 | 0 | 1 | 0 | 0 | 0 | 1 |
| 13 | 1 | 1 | 1 | 0 | 0 | 0 |
| 14 | 1 | 1 | 0 | 1 | 0 | 0 |
| 15 | 1 | 1 | 0 | 0 | 1 | 0 |
| 16 | 1 | 1 | 0 | 0 | 0 | 1 |

311

321

331

411

421

431

PRECHARGE SIGNAL GENERATION CIRCUIT OF SEMICONDUCTOR MEMORY APPARATUS

CROSS-REFERENCES TO RELATED APPLICATION

The present application claims priority under 35 U.S.C. §119(a) to Korean Patent Application No. 10-2010-0116893, filed on Nov. 23, 2010, in the Korean Intellectual Property Office, which is incorporated herein by reference in its entirety as if set forth in full.

BACKGROUND

1. Technical Field

Various embodiments of the present invention relate to semiconductor memory apparatuses and related methods. In particular, certain embodiments relate to a precharge signal generation circuit of a semiconductor memory apparatus.

2. Related Art

FIG. 1 is a block diagram of a typical precharge signal generation circuit. As illustrated in FIG. 1, a precharge signal generation circuit 1 of a semiconductor memory apparatus may include a precharge signal generation unit 2 and a decoder 3.

The precharge signal generation unit 2 may include a first shift block 10, a second shift block 20, a third shift block 30, and a fourth shift block 40.

The first shift block 10 generates read/write precharge commands APCGCMD_RD and APCGCMD_WT in response to a precharge command APCG_CMD, a clock signal ICLK, a write flag signal WT_STATE, and control signals TWRX<2:3> and TWR_C<1:4>.

The write flag signal WT_STATE is at a high level in a writing operation and at a low level in a read operation.

The second shift block 20 generates bank precharge addresses APCGBK_WT<0> and APCGBK_RD<0> in response to a bank column address strobe signal CBK<0>, the clock signal ICLK, the write flag signal WT_STATE, and the control signals TWRX<2:3> and TWR_C<1:4>.

The third shift block 30 generates bank precharge addresses APCGBK_WT<1> and APCGBK_RD<1> in response to a bank column address strobe signal CBK<1>, the clock signal ICLK, the write flag signal WT_STATE, and the control signals TWRX<2:3> and TWR_C<1:4>.

The fourth shift block 40 generates bank precharge addresses APCGBK_WT<2> and APCGBK_RD<2> in response to a bank column address strobe signal CBK<2>, the clock signal ICLK, the write flag signal WT_STATE, and the control signals TWRX<2:3> and TWR_C<1:4>.

The decoder 3 generates precharge signals APCG<0:7> in response to the read/write precharge commands APCGCMD_RD and APCGCMD_WT and the read/write bank precharge addresses APCGBK_RD<0:2> and APCGBK_WT<0:2>.

FIG. 2 is a circuit diagram of the first shift block illustrated in FIG. 1. As illustrated in FIG. 2, the first shift block 10 may include a plurality of flip-flops DFFs, a plurality of control flip-flops DFFCs, a plurality of inverters IV1 to IV5, a plurality of AND gates AND1 to AND4, and a plurality of pass gates PG1 to PG4.

The second shift block 20, the third shift block 30, and the fourth shift block 40 may have the same configuration as that of the first shift block 10.

According to the operational specifications of a semiconductor memory apparatus, the write precharge command APCGCMD_WT and the bank precharge addresses APCGBK_WT<0:2> need to be generated by delaying the precharge command APCG_CMD by a write-related precharge standard time, that is, tWR (last data-in to precharge). The read precharge command APCGCMD_RD and the bank precharge addresses APCGBK_RD<0:2> need to be generated by delaying the bank column address strobe signals CBK<0:2> by a read-related precharge standard time, that is, 4tCK (ICLK of four cycles).

The first shift block 10, the second shift block 20, the third shift block 30, and the fourth shift block 40 are designed according to the truth table illustrated in FIG. 2 in order to satisfy the above-described conditions.

For example, it is assumed that the precharge command APCG_CMD, that is, a read with precharge command RD with auto-precharge is input.

At this time, since a read operation is performed, the write flag signal WT_STATE is at a low level.

Thus, the precharge command APCG_CMD is delayed by 4tCK through four flip-flops DFFs, so that the read precharge command APCGCMD_RD is activated to a high level through the AND gate AND1.

Since the write flag signal WT_STATE is at the low level, the output of the AND gate AND4 is locked to a low level. That is, the write precharge command APCGCMD_WT is deactivated.

Meanwhile, it is assumed that tWR is set to 5 and the precharge command APCG_CMD, that is, a write precharge command WT with auto-precharge is input.

At this time, since a write operation is performed, the write flag signal WT_STATE is at a high level.

Since the write flag signal WT_STATE is at the high level, the output of the AND gate AND1 is locked to a low level. That is, the read precharge command APCGCMD_RD is deactivated to a low level.

When tWR is 5, in the truth table, the control signal TWR_C<1> of the control signals TWRX<2:3> and TWR_C<1:4> has a logic value of '1' (high level), the other control signals have a logic value of '0' (low level), and the write flag signal WT_STATE is at the high level.

Since the control signals TWRX<2:3> are at a low level, the AND gates AND2 and AND3 output a low level.

Thus, the operations of the flip-flop DFF and the control flip-flop DFFC, which receive the outputs of the AND gates AND2 and AND3 through clock terminals thereof, are stopped.

The control flip-flops DFFCs receiving the control signal TWRX<2> select a signal WT_APCG obtained by delaying the precharge command APCG_CMD by 4tCK through the four flip-flop DFFs.

The control flip-flops DFFCs receiving the control signal TWRX<2> and the flip-flop DFFs connected to the control flip-flops DFFCs output signals WR<5:8> by delaying the signal WT_APCG by 1tCK in response to the clock signal ICLK.

Since the logic value of control signal TWR_C<1> is a high level, the signal WR<5> is selected from the signals WR<5:8>. Furthermore, since the write flag signal WT_STATE is at the high level, the write precharge command APCGCMD_WT is activated to a high level through the AND gate AND4.

As a consequence, the precharge command APCG_CMD is delayed by 5tCK and is output as the write precharge command APCGCMD_WT.

However, in the semiconductor apparatus described above, the plurality of circuit blocks such as the first shift block 10, the second shift block 20, the third shift block 30, and the fourth shift block 40 take a substantial amount of circuit area. Furthermore, since each circuit block requires the clock signal ICLK, the load of the clock signal ICLK increases, so that the size of a driver for the clock signal ICLK also increases, resulting in an increase in current consumption.

SUMMARY

Accordingly, there is a need for an improved precharge signal generation circuit of a semiconductor memory apparatus which is capable of reducing the circuit area and current consumption.

To attain the advantages and in accordance with the purposes of the invention, as embodied and broadly described herein, a precharge signal generation circuit of a semiconductor memory apparatus may comprise: a read/write precharge command generation section configured to delay a precharge command by a first delay time set in response to a control signal to generate one of a read precharge command and a write precharge command; and a read/write bank precharge address generation section configured to delay a bank column address strobe signal by a second delay time set in response to the precharge command delayed in the read/write precharge command generation section, and generate one of a read bank precharge address and a write bank precharge address.

In another exemplary aspect of the present invention, a precharge signal generation circuit of a semiconductor memory apparatus may comprise: a first delay pass configured to delay a precharge command by first delay time in response to a control signal and a clock signal; a second delay pass configured to delay a bank column address strobe signal by a delay time, which is substantially identical to the first delay time, in response to the precharge command delayed in the first delay pass in a unit manner, and generate a bank column address strobe signal; a signal combination part configured to combine the precharge command delayed in the unit manner with a write flag signal for defining a write operation to generate a write precharge command, and combine the bank column address strobe signal with the write flag signal to generate a write bank precharge address; and a decoder configured to generate a precharge signal in response to the read precharge command and the write bank precharge address.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

FIG. 5 is a truth table according to FIG. 4.

DETAILED DESCRIPTION

Figure 1:
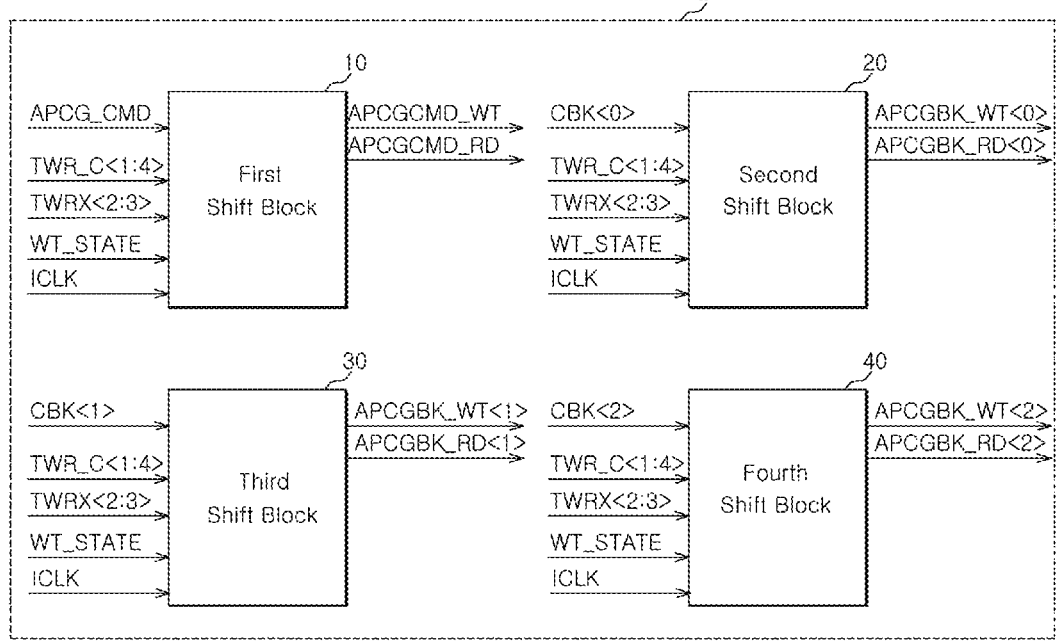
FIG. 1 is a block diagram of a typical precharge signal generation circuit.
Figure 1:
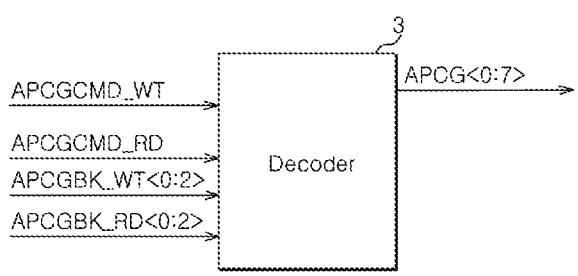
Figure 2:
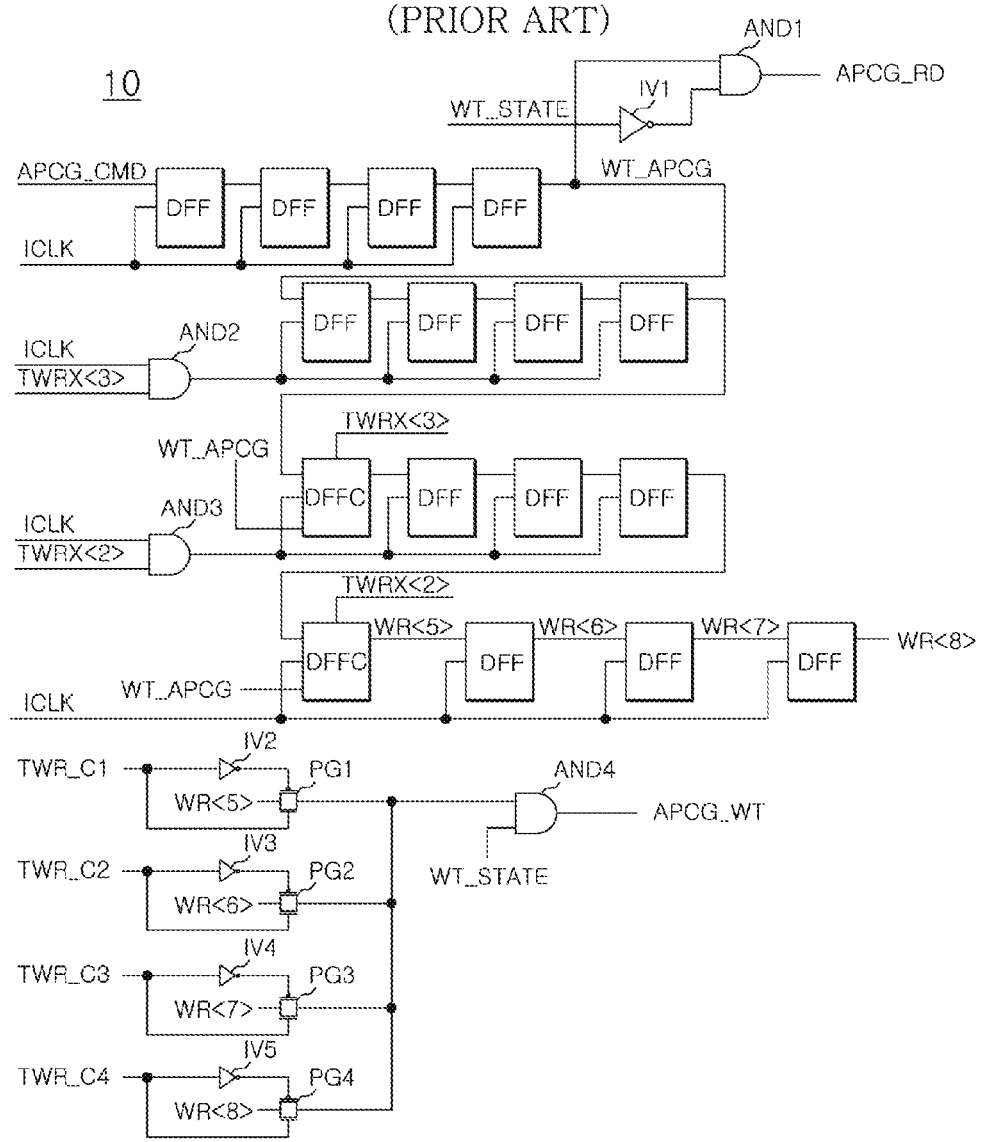
FIG. 2 is a circuit diagram of a first shift block illustrated in FIG. 1.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 3:
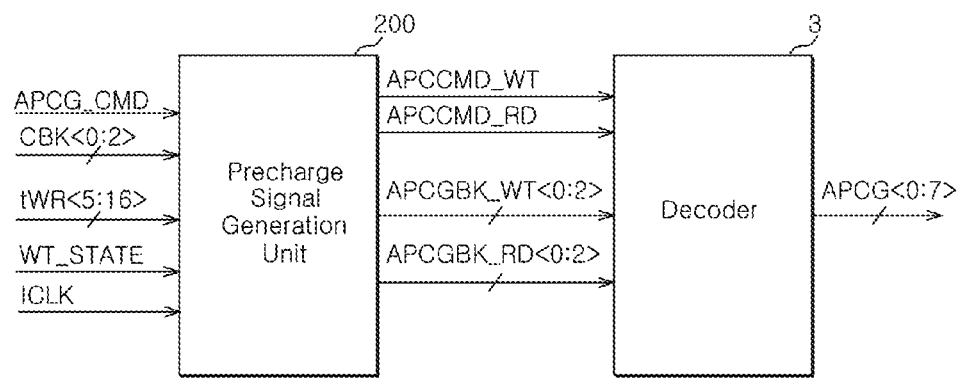
FIG. 3 is a block diagram of a precharge signal generation circuit according to one embodiment.

FIG. 3 is a block diagram of a precharge signal generation circuit according to one embodiment of the invention. As illustrated in FIG. 3, a precharge signal generation circuit 100 according to an embodiment of the invention may include a precharge signal generation unit 200 and a decoder 3.

The precharge signal generation unit 200 is configured to generate read/write precharge commands APCGCMD_RD and APCGCMD_WT and read/write bank precharge addresses APCGBK_RD<0:2> and APCGBK_WT<0:2> in response to a precharge command APCG_CMD, bank column address strobe signals CBK<0:2>, write-related precharge standard times tWR<5:16>, a write flag signal WT_STATE, and a clock signal ICLK.

The decoder 3 is configured to generate precharge signals APCG<0:7> in response to the read/write precharge commands APCGCMD_RD and APCGCMD_WT and the read/write bank precharge addresses APCGBK_RD<0:2> and APCGBK_WT<0:2>. The decoder 3 may have the same configuration as that of FIG. 1.

Figure 4:
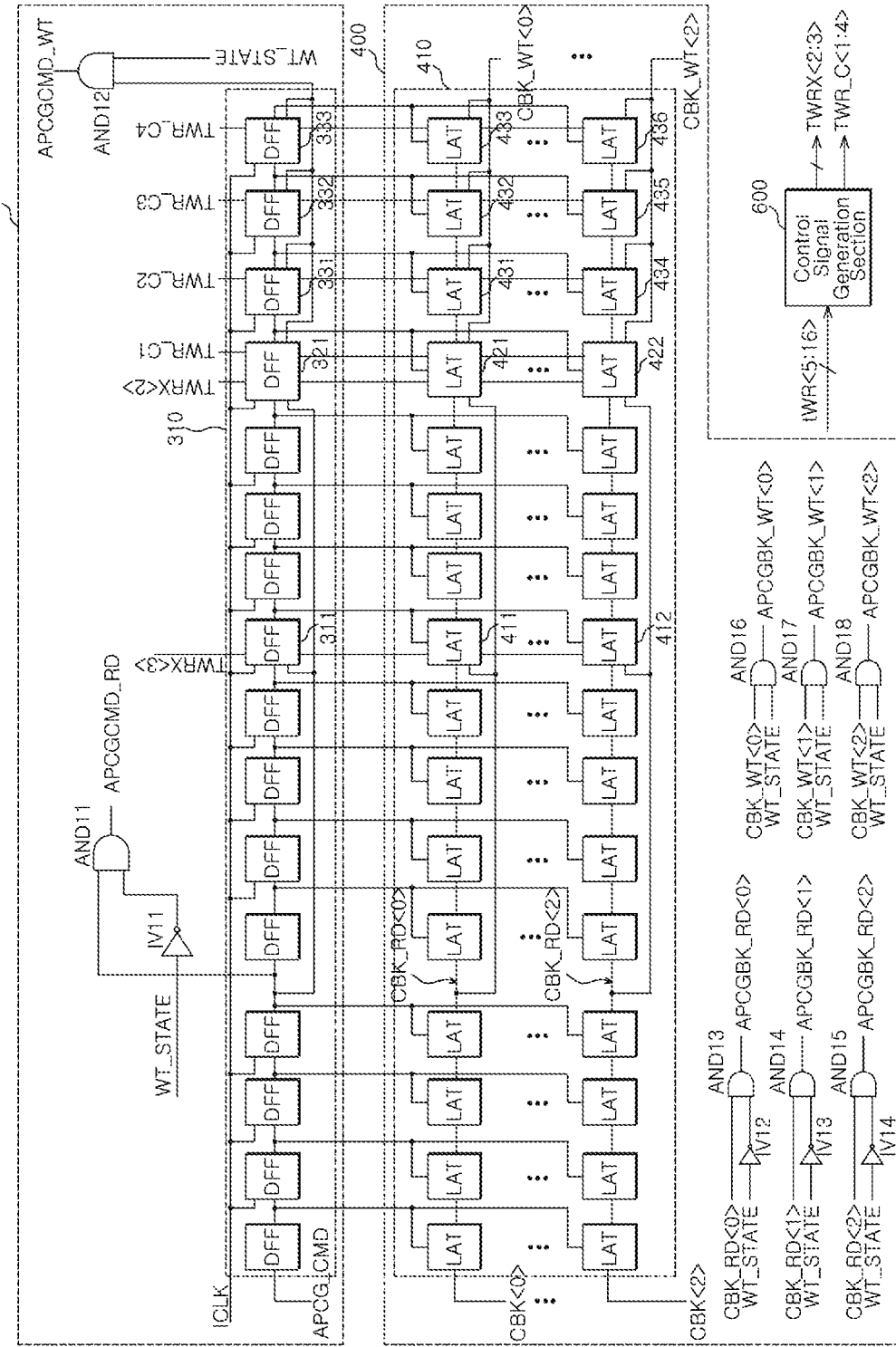
FIG. 4 is a circuit diagram of a precharge signal generation unit illustrated in FIG. 3.

FIG. 4 is a circuit diagram of a precharge signal generation unit illustrated in FIG. 3. As illustrated in FIG. 4, the precharge signal generation unit 200 may include read/write precharge command generation section 300, a read/write bank precharge address generation section 400, and a control signal generation section 600.

The read/write precharge command generation section 300 is configured to delay the precharge command APCG_CMD by a delay time set in response to control signals TWRX<2:3> and TWR_C<1:4> and generate the read precharge command APCGCMD_RD or the write precharge command APCGCMD_WT.

The read/write precharge command generation section 300 may include a first delay pass 310 and a first signal combination part IV11, AND11 and AND12.

The first delay pass 310 is configured to delay the precharge command APCG_CMD by a clock cycle tCK, which is set in response to the control signals TWRX<2:3> and TWR_C<1:4>, in response to the clock signal ICLK.

The first delay pass 310 is a unit delay unit and includes a plurality of flip-flops DFFs. Among the plurality of flip-flops DFFs, some flip-flops 311, 321 and 331 to 333 are controlled by two bits or more of the control signals TWRX<2:3> and TWR_C<1:4>.

The first signal combination part IV11, AND11 and AND12 is configured to combine the output signal of the first delay pass 310 with the write flag signal WT_STATE and generate the read precharge command APCGCMD_RD or the write precharge command APCGCMD_WT.

The read/write bank precharge address generation section 400 is configured to delay the bank column address strobe signals CBK<0:2> by a delay time set in response to the precharge command APCG_CMD delayed through the first delay pass 310, and generate the read bank precharge addresses APCGBK_RD<0:2> or the write bank precharge address APCGBK_WT<0:2>.

The read/write bank precharge address generation section 400 includes a second delay pass 410 and a second signal combination part IV12 to IV14 and AND13 to AND18.

The second delay pass 410 is configured to delay the bank column address strobe signals CBK<0:2> by a clock cycle tCK set in response to the output signal of the first delay pass 310 and generate read bank column address strobe signals CBK_RD<0:2> and write bank column address strobe signals CBK_WT<0:2>.

The second delay pass 410 is a unit delay unit and includes a plurality of latches LATs. Among the plurality of latches LATs, some latches 411, 412, 421, 422, and 431 and 436 are controlled by two bits or more of the control signals TWRX<2:3> and TWR_C<1:4>.

The second signal combination part IV12 to IV14 and AND13 to AND18 is configured to logically combine the read/write bank column address strobe signals CBK_RD<0:2> and CBK_WT<0:2> with the write flag signal WT_STATE, and generate read bank precharge addresses APCGBK_RD<0:2> or write bank precharge addresses APCGBK_WT<0:2>.

The control signal generation section 600 is configured to generate the control signals TWRX<2:3> and TWR_C<1:4> in response to write-related precharge standard times tWR<5:16>. The control signal generation section 600 may include a decoder.

According to the operational specifications of a semiconductor memory apparatus, the write precharge command APCGCMD_WT and the bank precharge addresses APCGBK_WT<0:2> need to be generated by delaying the precharge command APCG_CMD by a write-related precharge standard time, that is, tWR (last data-in to precharge). The read precharge command APCGCMD_RD and the read bank precharge addresses APCGBK_RD<0:2> need to be generated by delaying the bank column address strobe signals CBK<0:2> by a read-related precharge standard time, that is, 4tCK (ICLK of four cycles).

FIG. 5 is a truth table according to FIG. 4. In this regard, the embodiment includes the circuits according to the truth table illustrated in FIG. 5 capable of satisfying the write-related precharge standard times tWR<5:16> and the read-related precharge standard time (4tCK). That is, the control signals TWRX<2:3> and TWR_C<1:4> are input to the first delay pass 310 and the second delay pass 410 according to the truth table illustrated in FIG. 5.

FIGS. 6A to 6F illustrate the configuration of the flip-flops 311, 321 and 331 to 333 and the latches 411, 412, 421, 422, and 431 and 436.

Figure 6A:
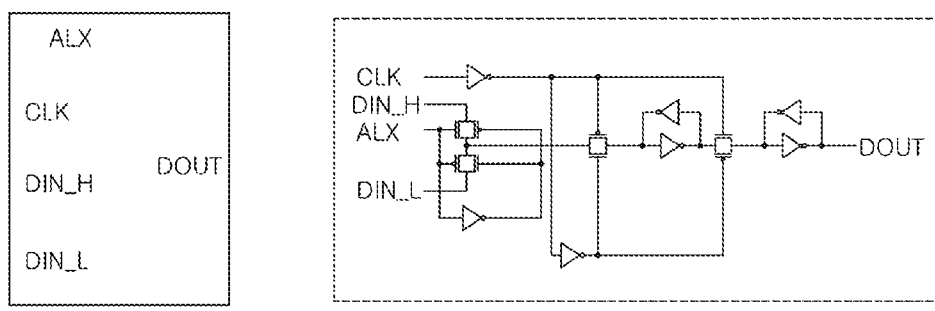
FIGS. 6A to 6F are circuit diagrams of flip-flops and latches illustrated in FIG. 4.

As illustrated in FIG. 6A, the flip-flop 311 includes a plurality of inverters and a plurality of pass gates.

The flip-flop 311 is configured to select one of two input terminals DIN_H and DIN_L according to the level of a control terminal ALX and output a signal latched in response to the clock signal ICLK through an output terminal DOUT.

Figure 6B:
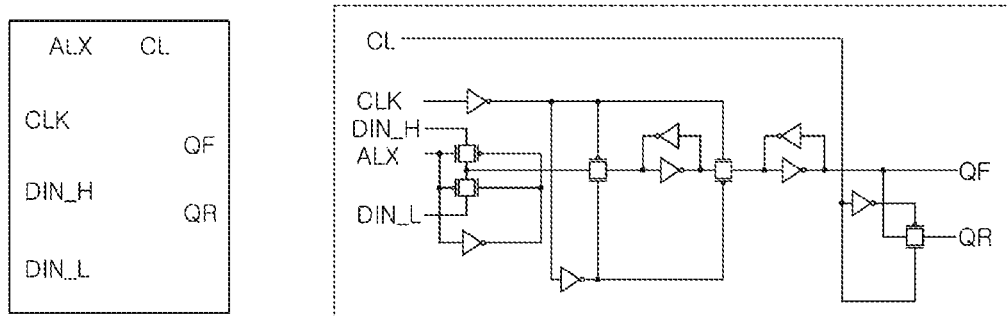

As illustrated in FIG. 6B, the flip-flop 321 includes a plurality of inverters and a plurality of pass gates.

The flip-flop 321 is configured to select one of two input terminals DIN_H and DIN_L according to the level of a control terminal ALX and output a signal latched in response to the clock signal ICLK through a first output terminal QF.

Furthermore, the flip-flop 321 is configured to output the signal latched in response to the clock signal ICLK through a second output terminal QR according to the level of a second control terminal CL.

Figure 6C:
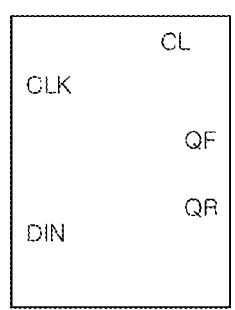
Figure 6C:
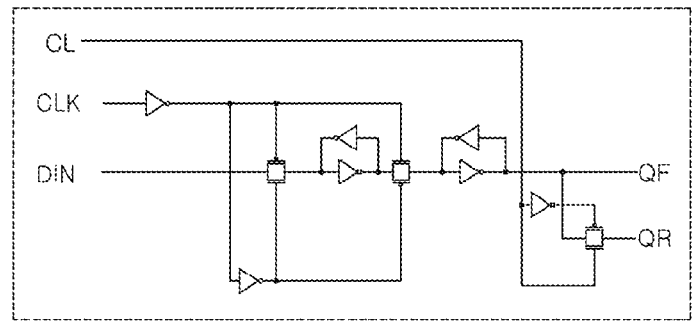

As illustrated in FIG. 6C, the flip-flop 331 includes a plurality of inverters and a plurality of flip-flops.

The flip-flop 331 is configured to latch a signal, which is input through an input terminal DIN, in response to the clock signal ICLK and output the latched signal through a first output terminal QF. Furthermore, the flip-flop 331 is configured to output the signal latched in response to the clock signal ICLK through a second output terminal QR according to the level of a control terminal CL.

The flip-flops 331 to 333 may have the same configuration.

Figure 6D:
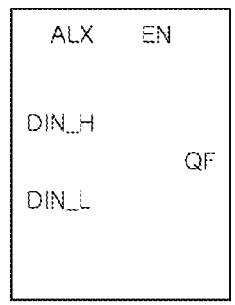
Figure 6D:
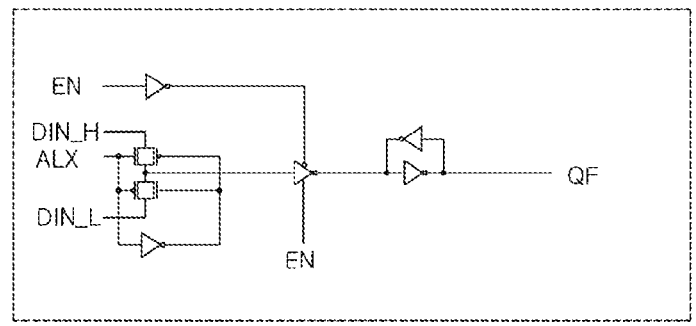

As illustrated in FIG. 6D, the latch 411 includes a plurality of inverters, a tri-state inverter and a plurality of pass gates.

The latch 411 is configured to select and latch one of two input terminals DIN_H and DIN_L according to the level of a control terminal ALX, and output a latched signal through an output terminal QF according to the level of an activation terminal EN.

Figure 6E:
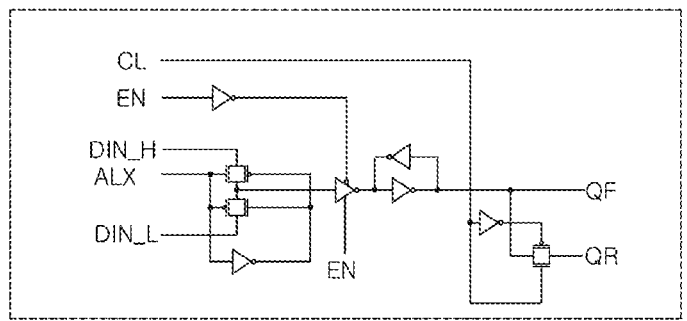

As illustrated in FIG. 6E, the latch 421 includes a plurality of inverters, a tri-state inverter and a plurality of pass gates.

The latch 421 is configured to select one of two input terminals DIN_H and DIN_L according to the level of a control terminal ALX, latch a selected signal according to the level of an activation terminal EN, and output the latched signal through a first output terminal QF. Furthermore, the latch 421 is configured to output the latched signal through a second output terminal QR according to the level of a second control terminal CL.

Figure 6F:
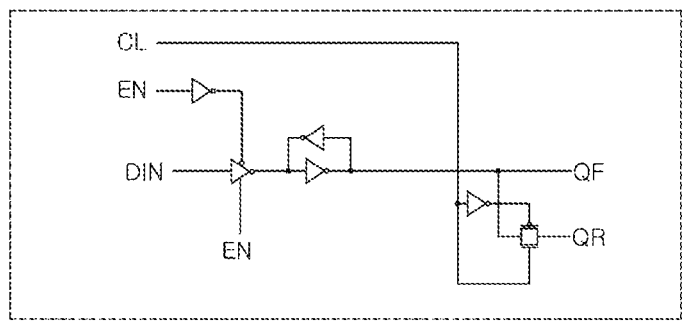

As illustrated in FIG. 6F, the latch 431 includes a plurality of inverters, a tri-state inverter and a pass gate.

The latch 431 is configured to latch a signal, which is input through an input terminal DIN, according to the level of an activation terminal EN, and output the latched signal through a first output terminal QF. Furthermore, the latch 431 is configured to output the latched signal through a second output terminal QR according to the level of a control terminal CL.

The latches 431 and 436 may have the same configuration.

The operation of the precharge signal generation circuit 100 configured as above according to the embodiment will be described with reference to FIGS. 4 and 5 below.

For example, it is assumed that the precharge command APCG_CMD, that is, a read with precharge command RD with auto-precharge is input.

At this time, since a read operation is performed, the write flag signal WT_STATE is at a low level.

Thus, the precharge command APCG_CMD delayed by 4tCK through four flip-flops DFFs is output as the read precharge command APCGCMD_RD through the AND gate AND11.

Since the write flag signal WT_STATE is at the low level, the output of the AND gate AND12 is locked to a low level regardless of another input. That is, the write precharge command APCGCMD_WT is deactivated.

Meanwhile, it is assumed that tWR is set to 10 and the precharge command APCG_CMD, that is, a write with precharge command WT with auto-precharge is input.

At this time, since a write operation is performed, the write flag signal WT_STATE is at a high level.

The control signal generation section 600 generates the control signals TWRX<2:3> and TWR_C<1:4> in response to the write-related precharge standard times tWR<5:16>.

At this time, since tWR is 10, in the truth table illustrated in FIG. 5, the control signals TWRX<2:3> and TWR_C<1:4> have a value of '100100'.

Thus, in the first delay pass 310, the four flip-flops DFFs, which receive a supply voltage VDD, the four flip-flops DFFs, which receive the control signal TWRX<2>, and the flip-flops 321 and 331, which receive the control signal TWR_C<1> or TWR_C<2>, are activated to delay the precharge command APCG_CMD in response to the clock signal ICLK.

The four flip-flops DFFs receiving the control signal TWRX<3> are deactivated to allow an input signal to pass therethrough, and the output signals of the flip-flops 332 and 333 are locked to a deactivation level, for example, a low level.

Since the write flag signal WT_STATE is at the high level, the precharge command APCG_CMD delayed through the flip-flop 331 is output as the write precharge command APCGCMD_WT.

As a consequence, the precharge command APCG_CMD is delayed by 10tCK through 10 flip-flops and is output as the write precharge command APCGCMD_WT.

Meanwhile, since the write flag signal WT_STATE is at the high level, the output of the AND gate AND11 is locked to a low level. That is, the read precharge command APCGCMD_RD is deactivated to a low level.

The latches LATs of the second delay pass 410 are activated according to the precharge command APCG_CMD sequentially delayed through the first delay pass 310, that is, the outputs of the flip-flops DFFs regardless of the clock signal ICLK.

That is, since the latches LATs of the second delay pass 410 are controlled according to the outputs of the flip-flops DFFs of the first delay pass 310, it is possible to apply the same delay time as that of the first delay pass 310 to the bank column address strobe signals CBK<0:2> without using the clock signal ICLK.

Thus, the bank column address strobe signals CBK<0:2> are delayed by 4tCK to generate the read bank column address strobe signals CBK_RD<0:2>, and the bank column address strobe signals CBK<0:2> are delayed by 10tCK to generate the write bank column address strobe signals CBK_WT<0:2>.

The write bank column address strobe signals CBK_WT<0:2> are combined with the write flag signal WT_STATE through the second signal combination part IV12 to IV14 and AND13 to AND18 to generate the read bank precharge addresses APCGBK_RD<0:2> or the write bank precharge address APCGBK_WT<0:2>.

That is, when the read with precharge command RD with auto-precharge is input, since the write flag signal WT_STATE is at the low level, the read bank precharge addresses APCGBK_RD<0:2> are generated.

Meanwhile, when the write with precharge command WT with auto-precharge is input, since the write flag signal WT_STATE is at the high level, the write bank precharge address APCGBK_WT<0:2> are generated.

As a consequence, the read precharge command APCGCMD_RD and the read bank precharge addresses APCGBK_RD<0:2> are generated after the same time (i.e., 4tCK) from the time point at which the read with precharge command RD with auto-precharge is input.

The write precharge command APCGCMD_WT and the write bank precharge addresses APCGBK_WT<0:2> are generated after the same time (i.e., 10tCK) from the time point at which the write with precharge command WT with auto-precharge is input.

Then, the decoder 3 generates the precharge signals APCG<0:7> in response to the read/write precharge command APCGCMD_RD and APCGCMD_WT and the read/write bank precharge addresses APCGBK_RD<0:2> and APCGBK_WT<0:2>.

The read with auto-precharge or write with auto-precharge is performed with respect to a specific memory bank of a plurality of memory banks of the semiconductor memory apparatus according to the precharge signals APCG<0:7>.

Figure 7:
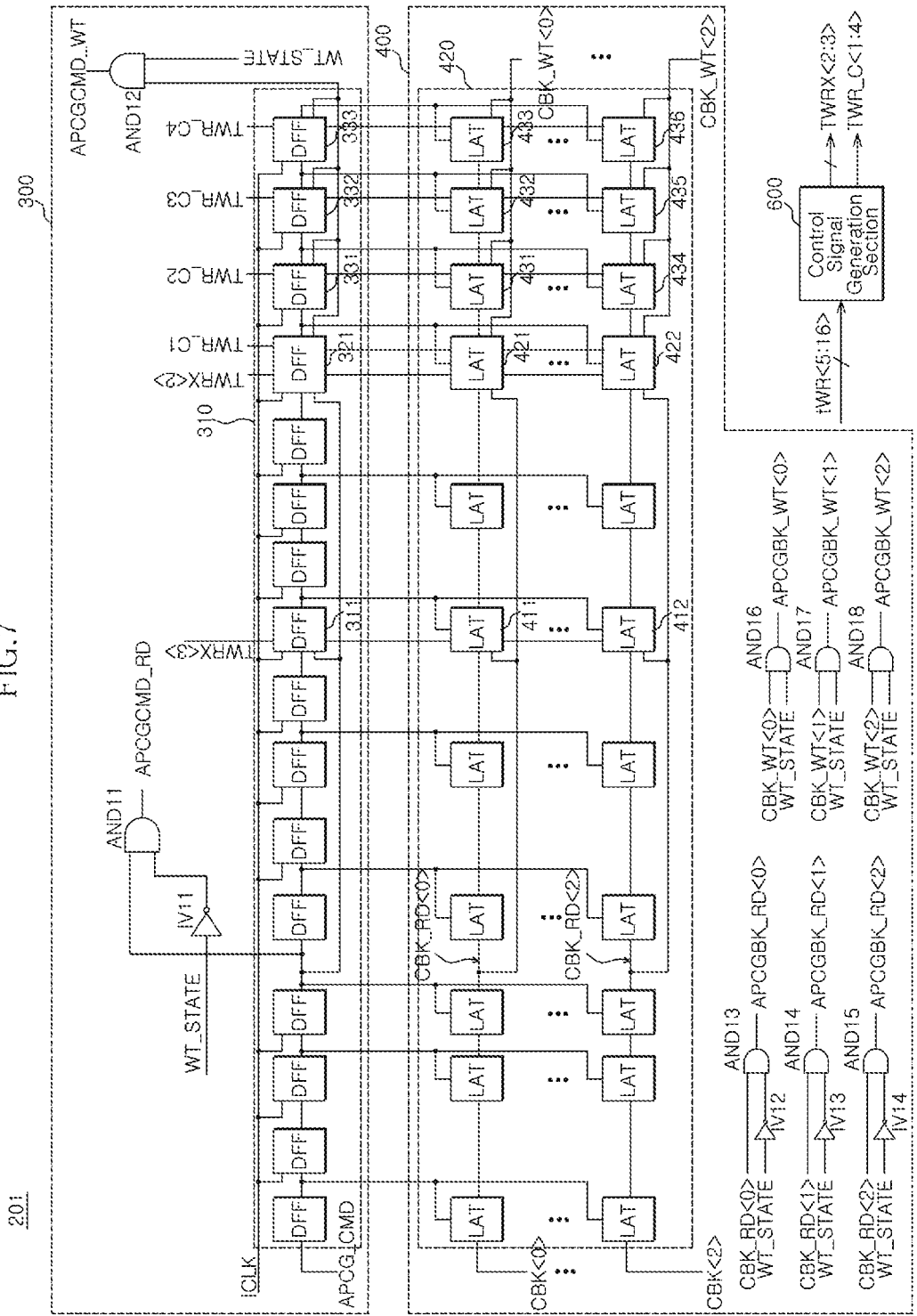
FIGS. 7 and 8 are block diagrams of precharge signal generation units according to another embodiment.
Figure 8:
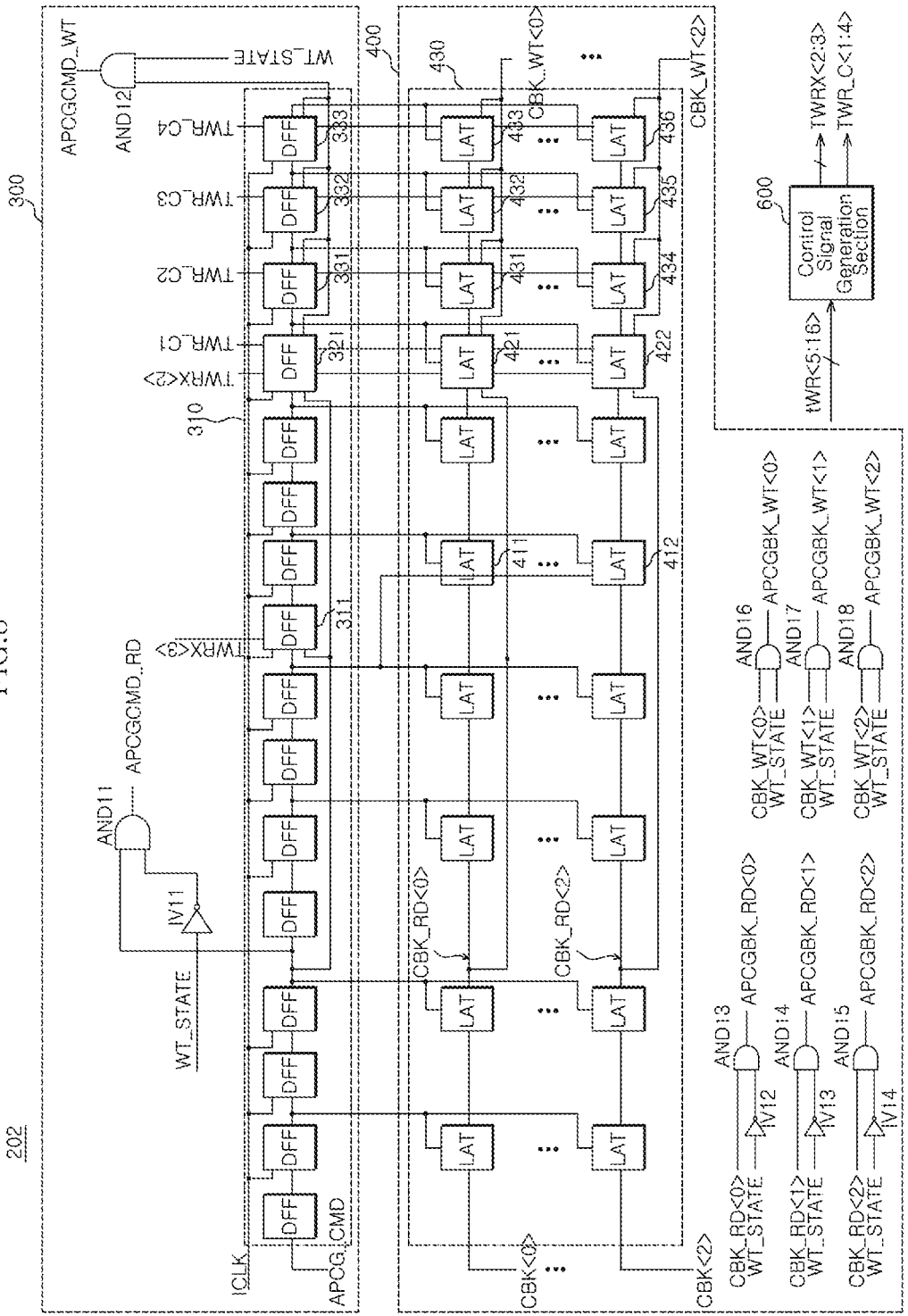

FIGS. 7 and 8 illustrate precharge signal generation units 201 and 202 according to another embodiment.

Under the condition that tCCD=4tCK, when the bank column address strobe signals CBK<0:2> are latched every 2tCK, it is possible to sufficiently ensure a timing margin without causing problems in a precharge signal generation operation.

FIGS. 7 and 8 are block diagrams of precharge signal generation units according to another embodiment. In this regard, FIG. 7 illustrates an example of the precharge signal generation unit 201 capable of latching the bank column address strobe signals CBK<0:2> every 2tCK. The bank column address strobe signals CBK<0:2> are latched every 2tCK, so that it is possible to remove latches LATs as illustrated in FIG. 7, resulting in the reduction in a circuit area and current consumption.

Furthermore, even when the bank column address strobe signals CBK<0:2> are latched every 3tCK, it is possible to normally perform the precharge signal generation operation.

In this regard, FIG. 8 illustrates an example of the precharge signal generation unit 202 capable of latching the bank column address strobe signals CBK<0:2> every 3tCK. The bank column address strobe signals CBK<0:2> are latched every 3tCK, so that it is possible to remove many more latches LATs relative to FIG. 7, resulting in the reduction in a circuit area and current consumption.

According to the embodiment of the invention, since only a part of an entire circuit configuration operates based on a clock signal, a clock load can be reduced and thus the size of a clock driver can also be reduced, resulting in the reduction in a circuit area and current consumption.

While certain embodiments have been described above, it will be understood to those skilled in the art that the embodiments described are by way of example only. Accordingly, the precharge signal generation circuit of the semiconductor memory apparatus described herein should not be limited based on the described embodiments. Rather, the precharge signal generation circuit of the semiconductor memory apparatus described herein should only be limited in light of the claims that follow when taken in conjunction with the above description and accompanying drawings.

What is claimed is:

1. A precharge signal generation circuit of a semiconductor memory apparatus, comprising:
    a read/write precharge command generation section configured to delay a precharge command by a first delay time set in response to a control signal to generate one of a read precharge command and a write precharge command; and
    a read/write bank precharge address generation section configured to delay a bank column address strobe signal by a second delay time set in response to the precharge command delayed in the read/write precharge command generation section, and generate one of a read bank precharge address and a write bank precharge address.

2. The precharge signal generation circuit according to claim 1, further comprising:
    a control signal generation section configured to generate the control signal in response to write-related precharge standard time.

3. The precharge signal generation circuit according to claim 1, further comprising:
a decoder configured to generate a precharge signal in response to the read precharge command, the write precharge command, the read bank precharge address, and the write bank precharge address.

4. The precharge signal generation circuit according to claim 1, wherein the first delay time is substantially identical to the second delay time.

5. The precharge signal generation circuit according to claim 1, wherein the read/write precharge command generation section comprises:
a delay pass configured to delay the precharge command by the first delay time in response to the control signal and a clock signal; and
a signal combination part configured to combine the precharge command internally delayed with a write flag signal for defining a write operation, and generate one of the read precharge command and the write precharge command.

6. The precharge signal generation circuit according to claim 5, wherein the delay pass comprises:
a plurality of flip-flops configured to commonly receive the clock signal and selectively receive the control signal.

7. The precharge signal generation circuit according to claim 1, wherein the read/write bank precharge address generation section comprises:
a delay pass configured to delay the bank column address strobe signals by the second delay time set in response to the precharge command internally delayed in the read/write precharge command generation section, and generate a read bank column address strobe signal and a write bank column address strobe signal; and
a signal combination part configured to combine the read bank column address strobe signal and the write bank column address strobe signal with a write flag signal for defining a write operation, and generate one of the read bank precharge address and the write bank precharge address.

8. The precharge signal generation circuit according to claim 7, wherein the delay pass comprises:
a plurality of latches configured to be selectively activated according to the precharge command internally delayed in the read/write precharge command generation section.

9. The precharge signal generation circuit according to claim 3, wherein one of read with auto-precharge and write with auto-precharge is performed with respect to a specific memory bank of a plurality of memory banks of the semiconductor memory apparatus according to the precharge signal.

10. A precharge signal generation circuit of a semiconductor memory apparatus, comprising:
a first delay pass configured to delay a precharge command by first delay time in response to a control signal and a clock signal;
a second delay pass configured to delay a bank column address strobe signal by a delay time, which is substantially identical to the first delay time, in response to the precharge command delayed in the first delay pass in a unit manner, and generate a bank column address strobe signal;
a signal combination part configured to combine the precharge command delayed in the unit manner with a write flag signal for defining a write operation to generate a write precharge command, and combine the bank column address strobe signal with the write flag signal to generate a write bank precharge address; and
a decoder configured to generate a precharge signal in response to the read precharge command and the write bank precharge address.

11. The precharge signal generation circuit according to claim 10, further comprising:
a control signal generation section configured to generate the control signal in response to write-related precharge standard time.

12. The precharge signal generation circuit according to claim 10, wherein the first delay pass comprises:
a plurality of flip-flops configured to commonly receive the clock signal and selectively receive the control signal.

13. The precharge signal generation circuit according to claim 10, wherein the second delay pass comprises:
a plurality of latches configured to be selectively activated according to the precharge command delayed in the unit manner.

14. The precharge signal generation circuit according to claim 10, wherein one of read with auto-precharge and write with auto-precharge performed with respect to a specific memory bank of a plurality of memory banks of the semiconductor memory apparatus according to the precharge signal.

* * * * *